(12) United States Patent
Kawai

(10) Patent No.: US 9,093,282 B2
(45) Date of Patent: Jul. 28, 2015

(54) ELECTRONIC COMPONENT MOUNTING DEVICE AND METHOD FOR PRODUCING THE SAME

(75) Inventor: Wakahiro Kawai, Konan (JP)

(73) Assignee: OMRON Corporation, Kyoto (JP)

( * ) Notice: Subject to any disclaimer, the term of this patent is extended or adjusted under 35 U.S.C. 154(b) by 965 days.

(21) Appl. No.: 13/256,721

(22) PCT Filed: Apr. 15, 2010

(86) PCT No.: PCT/JP2010/056743
§ 371 (c)(1),
(2), (4) Date: Oct. 6, 2011

(87) PCT Pub. No.: WO2010/125925
PCT Pub. Date: Nov. 4, 2010

(65) Prior Publication Data
US 2012/0030941 A1 Feb. 9, 2012

(30) Foreign Application Priority Data

Apr. 28, 2009 (JP) .................................. 2009-109595

(51) Int. Cl.
*H01L 23/552* (2006.01)
*H01L 23/043* (2006.01)
(Continued)

(52) U.S. Cl.
CPC ............ *H01L 23/045* (2013.01); *B81B 7/0064* (2013.01); *H01L 23/24* (2013.01); *H01L 23/552* (2013.01); *H01L 24/97* (2013.01); *H01L 25/0655* (2013.01); *H01L 25/16* (2013.01);
(Continued)

(58) Field of Classification Search
CPC ................. H01L 23/552; H01L 2924/1461; H01L 2924/3025
USPC ........... 257/659, 660, 784, 704, 708, E23.181
See application file for complete search history.

(56) References Cited

U.S. PATENT DOCUMENTS 3,723,834 A 3/1973 Peters
4,445,274 A * 5/1984 Suzuki et al. ................... 29/832
(Continued)

FOREIGN PATENT DOCUMENTS

GB 1243846 A 8/1971
JP 3-6523 A 1/1991
(Continued)

OTHER PUBLICATIONS

International Search Report w/translation from PCT/JP2010/056743 dated Jul. 27, 2010 (4 pages).
(Continued)

*Primary Examiner* — Nitin Parekh
(74) *Attorney, Agent, or Firm* — Osha Liang LLP

(57) ABSTRACT

An electronic component mounting device having high productivity while enhancing the electromagnetic shielding effect, and a method for manufacturing the same, including a housing formed by a conductive metal material and electronic components to be mounted inside the housing. The housing is configured by a first box body and a second box body fixed so that respective openings face each other and has a conductive layer stacked through an insulating layer arranged on an outer side of the first box body. The first box body includes a through-hole for retrieving a conductive wire connected to the electronic component to the conductive layer, and the through-hole is arranged at a position covered by the conductive layer.

3 Claims, 7 Drawing Sheets

(51) Int. Cl.

| | |
|---|---|
| *H01L 23/045* | (2006.01) |
| *B81B 7/00* | (2006.01) |
| *H01L 23/24* | (2006.01) |
| *H01L 25/065* | (2006.01) |
| *H01L 25/16* | (2006.01) |
| *H05K 9/00* | (2006.01) |
| *H01L 23/00* | (2006.01) |

(52) U.S. Cl.
CPC ......... *H05K 9/0026* (2013.01); *B81B 2207/012* (2013.01); *H01L 24/45* (2013.01); *H01L 24/48* (2013.01); *H01L 2224/45144* (2013.01); *H01L 2224/48091* (2013.01); *H01L 2224/48137* (2013.01); *H01L 2224/48228* (2013.01); *H01L 2224/8592* (2013.01); *H01L 2924/01079* (2013.01); *H01L 2924/1461* (2013.01); *H01L 2924/3025* (2013.01); *Y10T 29/4913* (2015.01); *Y10T 29/53174* (2015.01)

(56) References Cited

U.S. PATENT DOCUMENTS

| | | | |
|---|---|---|---|
| 4,885,662 A | | 12/1989 | Bartholomew et al. |
| 5,639,989 A | * | 6/1997 | Higgins, III ............ 174/386 |
| 7,411,278 B2 | * | 8/2008 | Wen et al. ............ 257/659 |
| 2003/0232603 A1 | | 12/2003 | Tanaka et al. |
| 2005/0189622 A1 | * | 9/2005 | Humpston et al. ............ 257/659 |
| 2006/0197215 A1 | | 9/2006 | Potter |
| 2007/0096293 A1 | * | 5/2007 | Wen et al. ............ 257/704 |
| 2008/0037815 A1 | * | 2/2008 | Ito et al. ............ 381/355 |
| 2008/0063232 A1 | | 3/2008 | Song |
| 2008/0279407 A1 | | 11/2008 | Pahl |
| 2009/0057867 A1 | | 3/2009 | Hool |
| 2009/0127638 A1 | * | 5/2009 | Kilger et al. ............ 257/415 |
| 2010/0119087 A1 | | 5/2010 | Kimura |

FOREIGN PATENT DOCUMENTS

| | | |
|---|---|---|
| JP | 3-38698 U | 4/1991 |
| JP | 4-6893 A | 1/1992 |
| JP | 8-15236 B2 | 2/1996 |
| JP | 09-036512 A | 2/1997 |
| JP | 9-97854 A | 4/1997 |
| JP | 11-97820 A | 4/1999 |
| JP | 2002-261194 A | 9/2002 |
| JP | 2002-314027 A | 10/2002 |
| JP | 2004-22587 A | 1/2004 |
| JP | 2004-39764 A | 2/2004 |
| JP | 2008-005461 A | 1/2008 |
| JP | 2008-67383 A | 3/2008 |
| JP | 2008-199353 A | 8/2008 |
| JP | 2009-515443 A | 4/2009 |
| JP | 2009-188956 A | 8/2009 |
| WO | 2007/010361 A2 | 1/2007 |
| WO | 2007/054070 A1 | 5/2007 |
| WO | 2007/054071 A1 | 5/2007 |

OTHER PUBLICATIONS

Written Opinion from PCT/JP2010/056743 dated Jul. 27, 2010 (4 pages).
Office Action for Korean Application No. 10-2011-7020647 dated Aug. 6, 2012, with English translation thereof (12 pages).
Extended European Search Report issued in European Application No. 10769624.7, mailed on Sep. 10, 2013 (6 pages).
Japanese Office Action for Application No. 2009-109595, mailed on Feb. 26, 2013 (8 pages).

* cited by examiner

ELECTRONIC COMPONENT MOUNTING DEVICE AND METHOD FOR PRODUCING THE SAME

CROSS-REFERENCE TO RELATED APPLICATIONS

The present application claims priority from Japanese Patent Application No. 2009-109595, filed Apr. 28, 2009. The content of the priority application is hereby incorporated by reference in its entirety.

BACKGROUND OF INVENTION

1. Technical Field

One or more embodiments of the present invention relate to an electronic component mounting device in which an electronic component is mounted in a housing having an electromagnetic shielding function, and a method for manufacturing the same.

2. Background Art

An electronic component mounting device in which various types of electronic components are mounted in a housing is conventionally known. In such device, a technique of providing an electromagnetic shielding function to the housing or the like to suppress the electromagnetic noise from entering inside the device from the outside and to suppress the leakage of the electromagnetic noise from the inside to the outside is known.

In recent years, issues arising from the electromagnetic noise are increasing with miniaturization and higher speed operation of the electronic device on which the electronic component circuit is mounted. For instance, in an in-vehicle micro-computer or the like, the number of codes of the software exceeds 2 hundred thousand rows and the operation frequency reaches 100 MHz, and hence the false operation of the electronic circuit caused by the electromagnetic noise generated from each electronic component is significant. The electromagnetic resistance characteristic of the semiconductor chip is lowering due to miniaturization, microscopic wiring, and smaller power. Therefore, there is a further need to carry out electromagnetic shielding in order to protect the electronic component from external electromagnetic noise and to suppress the electromagnetic noise from the electronic component from leaking to the outside.

Conventionally, a method of placing a cap made of metal or made of resin performed with metal plating on an electronic component circuit substrate (see patent documents 1, 2), a method of coating an electronic component circuit substrate sealed with mold resin with a metal coating (see patent document 3), or the like is known for the electromagnetic shielding technique.

However, in the case of the method of placing a cap having conductivity on the electronic component circuit substrate as in the former case, the cap and the circuit substrate need to be electrically connected, which complicates the production step and increases the cost. The electromagnetic noise leaking from the gap of the wiring circuit of the circuit substrate and the size of the cap being limited by the shape of the circuit substrate thus limits the degree of freedom of design of the cap.

In the case of coating the electronic component circuit substrate with a metal coating as in the latter case, the resin molding step and the metal coating step such as plating and vapor deposition are required, and hence the material cost and the manufacturing cost increase.

A technique of mounting an electronic component inside a substantially sealed housing and providing the electromagnetic shielding function to the housing is also known (see e.g., patent documents 4, 5). The electronic component mounting device according to such related art example will be described with reference to FIG. 5. FIG. 5 is a schematic cross-sectional view of an electronic component mounting device according to a related art example.

In the electronic component mounting device according to the related art example, the housing is configured by a box body 100 and a flat plate shaped lid member 103, where an electronic component 102 is mounted inside the housing. The box body 100 is formed to a box shape having an opening by performing a sheet metal processing such as bend processing or drawing processing to a conductive metal plate. A wiring circuit 101 is formed on the surface of the bottom of the box body 100, and the electronic component 102 is mounted on such wiring circuit 101. The lid member 103 has a conductive circuit 104 formed on a flat plate shaped substrate made of resin.

The box body 100 and the lid member 103 configured as above are fixed such that the wiring circuit 101 and the conductive circuit 104 are electrically connected, so that the periphery of the electronic component 102 can be electromagnetically shielded.

In the conductive circuit 104 of the lid member 103, the gap between the circuits does not have conductivity and the electromagnetic noise may leak out from such portion. If a multi-layered wiring board is used as a countermeasure, the manufacturing cost increases. Furthermore, the wiring circuit 101 on the box body 100 and the conductive circuit 104 on the lid member 103 need to be electrically conducted and connected, and the productivity lowers due to the alignment step of the circuits, the partial supply step of a conductive adhesive, and a heating and curing step. Furthermore, the depth 110 needs to be higher than or equal to the height of the electronic component 102 in order to completely accommodate the electronic component 102 inside the box body 100. Therefore, the material and the processing shape to use are limited to ensure the bending amount, the drawing processing amount of the metal plate by the necessary amount in order to obtain the box body 100 through sheet metal processing. Moreover, the deformation stress involved when the flat plate shaped lid member 103 expands or contracts due to change in the surrounding environmental temperature or the like concentrates at a joining portion 120 of the lid member 103 and the box body 100. Therefore, the joining portion tends to easily strip.

Patent Document 1: Japanese Unexamined Patent Publication No. 08-15236
Patent Document 2: Japanese Unexamined Patent Publication No. 2008-67383
Patent Document 3: Japanese Unexamined Patent Publication No. 09-97854
Patent Document 4: Japanese Unexamined Patent Publication No. 04-6893
Patent Document 5: Japanese Unexamined Patent Publication No. 11-97820
Patent Document 6: Japanese Unexamined Patent Publication No. 2008-199353

SUMMARY OF INVENTION

One or more embodiments of the present invention may provide an electronic component mounting device having high productivity while enhancing the electromagnetic shielding effect, and a method for manufacturing the same.

An electronic component mounting device of one or more embodiments of the present invention relates to an electronic component mounting device including a housing formed by a conductive metal material and at least one electronic component to be mounted inside the housing, wherein the housing is configured by a first box body and a second box body fixed so that respective openings face each other and has a conductive layer stacked through an insulating layer arranged on an outer side of the first box body; and the first box body includes a through-hole for retrieving a conductive wire connected to the electronic component to the conductive layer, the through-hole being arranged at a position covered by the conductive layer.

According to the electronic component mounting device configured as above, the periphery of the electronic component is electromagnetically shielded because the electronic component is mounted inside the housing configured with a conductive metal material. The first box body configuring the housing is formed with the through-hole for retrieving the conductive wire connected to the electronic component to the conductive layer, but the electromagnetic shielding function is not deteriorated because the through-hole is covered by the conductive layer. Furthermore, the housing has high electromagnetic shielding effect and is strong as it is made of metal material.

The depth of the box of each box body can be made shallower than the height of the electronic component to be mounted because the housing is configured by the first box body and the second box body 203. Therefore, the depth of the box of the box body can be made shallower compared to when configuring the housing with one side as the box body and the other side as the flat plate shaped lid. The degree of freedom of design thus widens. As the degree of freedom of design widens, the processing ability of the box body can be enhanced and the productivity can be enhanced.

Because the housing is obtained by fixing two box bodies, the circuits do not need to be aligned and the conductive adhesive does not need to be partially supplied, whereby the productivity can be enhanced.

Furthermore, when each box body expands or contracts due to change in the surrounding environmental temperature or the like, the stress concentrates at the bent site in each box body, and hence the concentration of stress on the joining portion of the first box body and the second box body can be alleviated. The stripping of the joining portion of the first box body and the second box body thus can be suppressed.

At least one of the electronic components to be mounted in the first box body is arranged in a state projecting out to an interior side of the second box body than the opening in the first box body.

According to such configuration, the depth of the box of the first box body can be made shallow. The electronic component can be more easily mounted in the first box body because the depth of the box of the first box body is shallow.

The electronic component to be mounted in the first box body may be fixed by a potting portion filled in the first box body.

The electronic component thus can be more reliably fixed with respect to the first box body.

One of the electronic components is an MEMS microphone chip, and a sound perforation formed at an upper part of the MEMS microphone chip is arranged at a position projecting out to the interior side of the second box body than the opening of the first box body in a state where the MEMS microphone chip is fixed in the first box body by the potting portion.

Therefore, the sound perforation formed at the upper part of the MEMS microphone chip is arranged at the position projecting out to the interior side of the second box body, whereby the potting agent can be suppressed from entering the MEMS microphone chip even when the (liquid) potting agent before curing is filled in the first box body.

A method of manufacturing an electronic component mounting device of one or more embodiments of the present invention relates to a method of manufacturing an electronic component mounting device described above, the method including the steps of forming a first box body by sheet metal processing; forming a conductive layer through an insulating layer on an outer side of the first box body; mounting at least one electronic component in the first box body; electrically connecting the electronic component mounted in the first box body and the conductive layer with a conductive wire inserted through the through-hole formed in the first box body; and fixing a second box body obtained by sheet metal processing to the first box body.

As described above, in the electronic component mounting device of one or more embodiments of the present invention, the degree of freedom of design of the first box body and the second box body is wide and the depth of the box can be made shallow. Therefore, the sheet metal processing (bend processing or drawing processing) for forming the box body is relatively easy in one or more embodiments of the present invention. Accompanied therewith, the degree of freedom in selecting the material of the box body is also wide.

A bent portion bent to an outer side may be formed on an opening side of one of the first box body and the second box body; and the method may further include the step of fixing the first box body and the second box body through laser beam welding by applying a laser beam, with the other opening end of the first box body or the second box body and the bent portion brought into contact with each other, from a side opposite to a contacting portion with the other opening end at the bent portion.

The laser beam welding task thus can be more easily and accurately carried out.

The electronic component mounted in the first box body and the conductive layer may be electrically connected by the conductive wire, and a potting agent may be filled in the first box body to fix the second box body to the first box body.

Therefore, the potting region can be limited because the potting agent is filled to a range that satisfies the interior of the first box body at maximum.

The method further includes the steps of forming a plurality of portions that become the first box body through drawing process with respect to a first metal plate; forming a conductive layer through an insulating layer on an outer side of each portion that becomes the first box body;

mounting at least one electronic component in each portion that becomes the first box body;

electrically connecting the electronic component mounted on each portion that becomes the first box body and each conductive layer by a conductive wire inserted through a through-hole formed at the portion that becomes the first box body; and forming a plurality of portions that become the second box body through drawing process with respect to a second metal plate; wherein the method further includes a step of separating the portions that become each box body in the first metal plate and the second metal by cutting processing after fixing all the portions that become the first box body and the portions that become the second box body after terminating the steps.

A plurality of electronic component mounting devices thus can be manufactured through a series of manufacturing processes. Such manufacturing method is adopted mainly because the depth of the box of the first box body and the second box body can be made shallow. This is because the portion that becomes the box body needs to be shallow when forming a plurality of portions that become the box body in the metal plate through the drawing processing.

Each configuration described above may be combined as much as possible and adopted.

As described above, according to one or more embodiments of the present invention, the productivity can be enhanced while enhancing the electromagnetic shielding effect.

DETAILED DESCRIPTION

One or more embodiments for carrying out the invention will be hereinafter illustratively described in detail based on examples with reference to the drawings. However, the dimension, material, shape, relative arrangement, and the like of the configuring components described in the example are not intended to limit the scope of the invention unless specific description is made in particular. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

Figure 1:
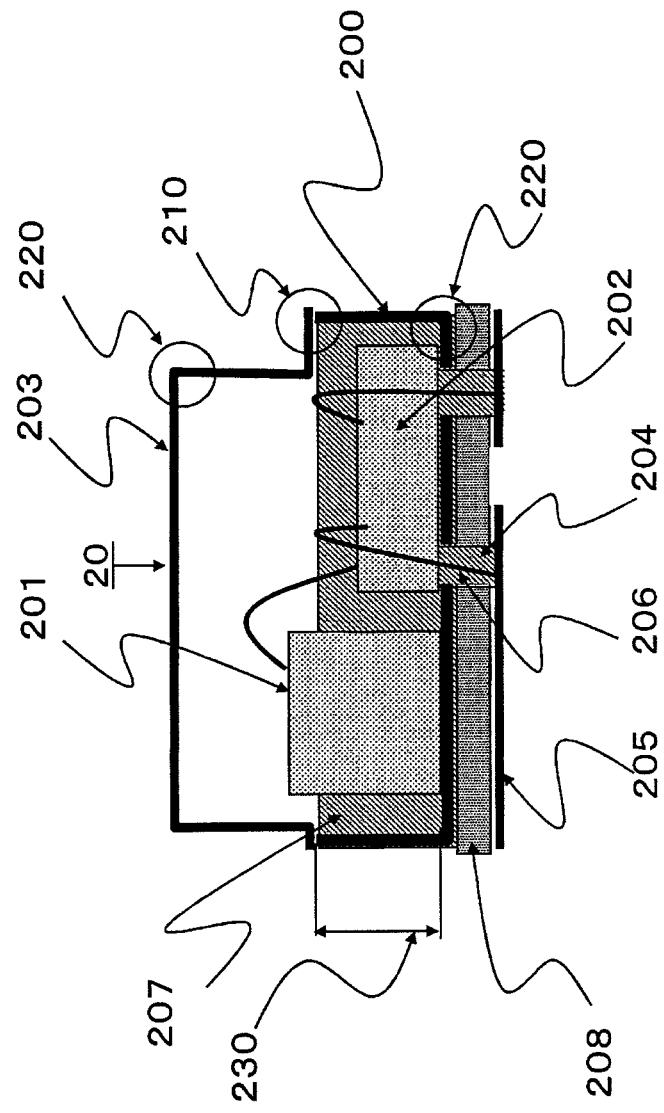
FIG. 1 is a schematic cross-sectional view of an electronic component mounting device according to one or more embodiments of the present invention.
Figure 2:
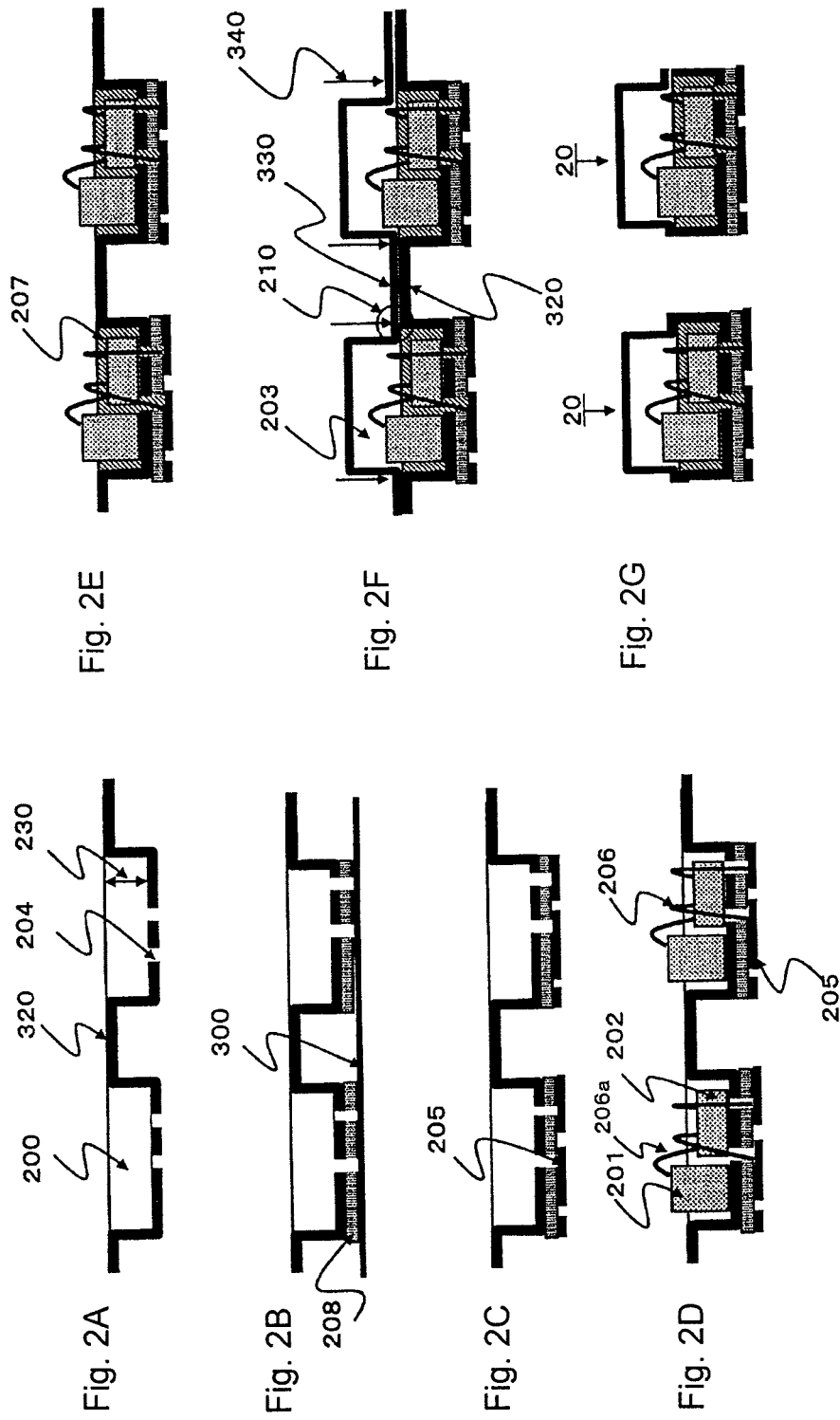
FIGS. 2A-2G are a view of the manufacturing processes of the electronic component mounting device according to one or more embodiments of the present invention.
Figure 3:
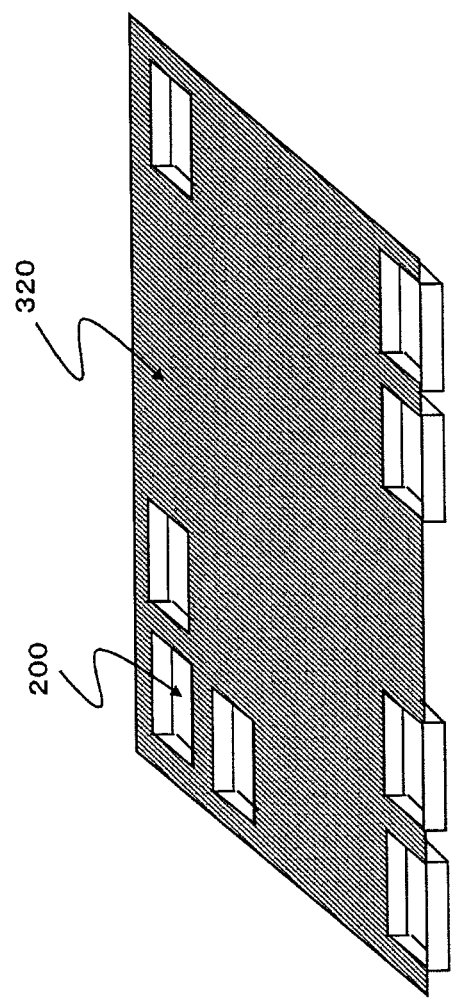
FIG. 3 is a view showing one part of the manufacturing process of the electronic component mounting device according to one or more embodiments of the present invention.

An electronic component mounting device and a method for manufacturing the same according to one or more embodiments of the present invention will be described with reference to FIG. 1 to FIG. 3.

<Electronic Component Mounting Device>

An electronic component mounting device 20 according to one or more embodiments of the present invention will be particularly described with reference to FIG. 1. The electronic component mounting device 20 according to one or more embodiments of the present invention includes a housing configured by a conductive metal material, and electronic components 201, 202 mounted inside the housing. Specific examples of the electronic components 201, 202 include a resistor, a capacitor, and an IC.

The housing according to one or more embodiments of the present invention are configured by a first box body 200 and a second box body 203. The first box body 200 and the second box body 203 are obtained by sheet metal processing, and are box-shaped members having an opening. The first box body 200 and the second box body 203 are fixed such that the respective openings face each other to configure the housing. In FIG. 1, the first box body 200 and the second box body 203 are fixed by a joining portion 210. An example of a joining method at the joining portion 210 includes metal welding and adhesion by conducive adhesive. In one or more embodiments of the present invention, the entire periphery of the opening of each box body is fixed. The interior of the housing is thus in a substantially sealed state.

One example of a material (metal plate) used for the first box body 200 includes a nickel-iron alloy (42 alloy) plate having a thickness of 0.15 mm. One example of a material (metal plate) used for the second box body 203 includes a nickel-iron alloy (42 alloy) plate having a thickness of 0.12 mm.

A conductive layer 205 stacked through an insulating layer 208 is provided on the outer side of the first boxy body 200 (outer side on bottom surface side herein). An example of the insulating layer 208 is a layer made of epoxy adhesive. An example of the conductive layer 205 is a circuit made of copper foil having a thickness of 18 µm.

The electronic components 201, 202 are mounted in the first box body 200. The electronic components 201, 202 are fixed by a potting portion 207 filled and cured in the first box body 200. An example of a potting agent that forms the potting portion 207 includes a sealant of epoxy series.

A through-hole 204 is formed at the bottom plate of the first box body 200. The through-hole 204 is provided to retrieve a conductive wire (e.g., gold wire) 206 connected to the electronic component 202 to the conductive layer 205. In other words, the conductive wire 206 is inserted to the through-hole 204, where one end side of the conductive wire 206 is electrically connected to the electronic component 202 and the other end side is electrically connected to the conductive layer 205. Although the through-hole 204 is formed at two areas in FIG. 1, it should be recognized that the number of through-holes 204 is appropriately set by the type and number of electronic components to be mounted.

<Method for Manufacturing Electronic Component Mounting Device>

A method for manufacturing the electronic component mounting device according to one or more embodiments of the present invention will be described in the order of the manufacturing processes with reference to FIG. 2 and FIG. 3.

(Process A (FIG. 2A))

In one or more embodiments of the present invention, a nickel-iron alloy (42 alloy) plate 320 (first metal plate) having a thickness of 0.15 mm is used for the material of the first box body 200. A plurality of recesses is formed in the nickel-iron alloy plate 320 through drawing processing, as shown in FIG. 3. The plurality of recesses are portions that become the first box body 200. In one or more embodiments of the present invention, such plurality of recesses are formed to line in a matrix form. Only the recesses at eight areas are shown for simplification in FIG. 3.

In one or more embodiments of the present invention, a nickel-iron alloy (42 alloy) plate 330 (second metal plate) having a thickness of 0.15 mm is used for the material of the second box body 203. Similar to the case of sheet metal processing in the nickel-iron alloy plate 320, the recess that becomes the second box body 203 is formed in plural so as to line in a matrix form (see FIG. 2F to be described later).

Therefore, it is effective in reducing the manufacturing cost and enhancing the productivity at the time of mass production to adopt a method of forming a plurality of recesses in a matrix form by drawing processing with respect to one metal plate.

With respect to the recess (portion corresponding to first box body 200) formed by the drawing processing with respect to the nickel-iron alloy plate 320, the shape and dimension of the bottom surface is appropriately set according to the number, size, and arrangement of the electronic component to mount. The depth 230 of the recess is set to be smaller than 1H with respect to the height H of the highest portion of the electronic component to mount. In one or more embodiments of the present invention, the nickel-iron alloy plate 320 has a thin thickness of 0.15 mm, and thus can be processed by the drawing processing such that the side surface of the recess becomes substantially perpendicular to the bottom surface.

In one or more embodiments of the present invention, the through-hole 204 is simultaneously formed by press working at the bottom plate of the recess that becomes the first box body 200 at the time of the drawing processing. In one or more embodiments of the present invention, the diameter of the through-hole 204 is about 1.0 mm.

(Process B (FIG. 2B))

The epoxy series adhesive is then applied to the back surface side of the plurality of recesses formed in the nickel-iron alloy plate 320 by screen printing, or the like such that the thickness becomes about 10 to 15 μm. The adhesive is applied over the entire surface of the portion excluding the site where the through-hole 204 is formed at the back surface of the recess. A copper foil 300 having a thickness of 18 μm is then attached on the applied adhesive to cover the nickel-iron alloy plate 320. Thereafter, pressure of 5 to 10 kgf/cm2 is applied on the copper foil 300 under an environment of 150° C. The copper foil 300 is thereby securely attached to the back surface side of the recess in the nickel-iron alloy plate 320 through a layer including adhesive by pressurizing while heating. The layer including adhesive corresponds to the insulating layer 208 described above.

(Process C (FIG. 2C))

The copper foil 300 securely attached to the back surface side of the recess in the nickel-iron alloy plate 320 by process B is then etched to a predetermined pattern to form the conductive layer 205. Such conductive layer 205 functions as a circuit configured with a predetermined pattern. The through-hole 204 is at a position to be covered by the conductive layer 205 after etching.

The etching method in one or more embodiments of the present invention adopts a known etching method used to fabricate a print circuit substrate. In other words, a photosensitive dry film is first laminated on the surface of the copper foil 300. It is then exposed with a wiring pattern of a predetermined shape and then developed, and thereafter, the exposed copper foil portion is etched with liquid such as ferric chloride.

After the etching, gold is coated on the portion exposed by the through-hole 204 of the surface of the conductive layer 205 (lower surface in FIG. 2) and the back surface of the conductive layer 205 such that the thickness is about 15 μm. The coating is carried out through a known flash plating method, or the like.

(Process D (FIG. 2D))

The electronic components 201, 202 are then mounted in the recess formed in the nickel-iron alloy plate 320. In other words, the electronic components 201, 202 are respectively arranged in each recess, and the electrical connection between the electronic components or between the electronic component and the circuit is appropriately carried out. One or more embodiments of the present invention includes a task of electrically connecting the electronic component 202 and the conductive layer 205 with the conductive wire 206. This task has a structural feature in that the electrode of the electronic component 202 and the conductive layer 205 are connected with the conductive wire 206 inserted to the through-hole 204. However, the nickel-iron alloy plate 320 can mount the electronic component 202 through a typical surface mounting technique such as a known die bonding or wire bonding because the thickness is thin, i.e., 0.15 mm.

The electronic component 201 has a higher height than the electronic component 202, the electronic component 201 and the electronic component 202 being mounted in one or more embodiments of the present invention. The drawing depth 230 in the process A is set so as to be greater than H1/2 and smaller than H1 with respect to the height H1 in which a loop height of the conductive wire 206a connected to the electronic component 201 is added to the height of the electronic component 201.

(Process E (FIG. 2E))

A liquid potting agent (epoxy series sealant) is then filled inside the recess that becomes the first box body 200 in the nickel-iron alloy plate 320. The potting portion 207 is formed by curing the liquid potting agent. The electronic components 201, 202 are thereby more reliably fixed in the recess, and each electrical connecting portion is protected.

Because the potting portion 207 is formed by filling the potting agent in the recess that becomes the first box body 200, the potting agent can be suppressed from running out to the outer side than the opening of the first box body 200. Accompanied therewith, the potting agent can be suppressed from attaching to the portion (one part of electronic component 201 in one or more embodiments of the present invention) projecting out to the outer side than the opening of the electronic component mounted in the recess. That is, the height of the potting portion 207 can be limited to smaller than or equal to a constant value in the electronic component mounting device 20.

The heat generated from the electronic components 201, 202 can be efficiently transmitted to the first box body 200 by mixing filler such as metal or aluminum nitride to the potting agent. The heat dissipation effect is thereby enhanced.

(Process F (FIG. 2F))

The alloy plates are overlapped such that the plurality of recesses that become the first box body 200 formed in matrix form in the nickel-iron alloy plate 320 and the plurality of recesses that become the second box body 203 formed in matrix form in the nickel-iron alloy plate 330 overlap with each other.

The opening of the recess that becomes the second box body 203 is formed to be one size smaller than the opening of the recess that becomes the first box body 200. Thus, focusing on the portion that becomes each box body, a bent portion bent to the outer side is formed on the opening side of the second box body 203, so that the opening end of the first box body 200 and the bent portion are to be in a contacted state. A laser beam is emitted from the side opposite to the contacting portion with the opening end of the first box body 200 at the bent portion in the contacted state, so that the portions that become each box body are fixed by laser beam welding.

When fixing the alloy plates, the laser beam welding described above is the most suitable for the joining method of electrically conducting the alloy plates and obtaining sufficient strength with respect to the external stress. However, if the size of the opening of the first box body 200 and the opening of the second box body 203 is the same, the opening ends become the joining portion, and hence the laser beam needs to be applied diagonally and welding may not be appropriately carried out. In one or more embodiments of the present invention, on the other hand, the size of the opening of each box body is differed so that the laser beam can be applied straightly on the joining portion 210 (see arrow in FIG. 2F) and appropriate welding can be carried out. In one or more embodiments of the present invention, a configuration in which the opening of the second box body 203 is one size smaller than the opening of the first box body 200 is adopted, but a configuration in which the opening of the first box body 200 is one size smaller than the opening of the second box body 203. In this case, an appropriate welding can obviously be carried out, similar to the case described above, by applying the laser beam from the first box body 200 side.

(Process G (FIG. 2G))

Lastly, the portions that become each box body in the nickel-iron alloy plate 320 and the nickel-iron alloy plate 330 are separated by cutting processing. A plurality of electronic component mounting devices 20 thus can be obtained.

According to the electronic component mounting device 20 of one or more embodiments of the present invention configured as above, the electronic components 201, 202 are mounted inside the housing configured with a conductive metal material. The interior of the housing is in a substantially sealed state. The periphery of the electronic components 201, 202 is thus electromagnetically shielded. Therefore, the electronic components 201, 202 are protected from the external electromagnetic noise and the electromagnetic noise from the electronic components 201, 202 is suppressed from leaking to the outside.

The first box body 200 configuring the housing is formed with the through-hole 204 for retrieving the conductive wire 206 connected to the electronic component 202 to the conductive layer 205, but the electromagnetic shielding function is not affected because the through-hole 204 is covered by the conductive layer 205. Furthermore, the housing has high electromagnetic shielding effect and is strong because it is made of metal material.

The depth of the box of each box body can be made shallower than the height of the electronic component to be mounted because the housing is configured by the first box body 200 and the second box body 203. Therefore, the depth of the box of the box body can be made shallower compared to when configuring the housing with one side as the box body and the other side as the flat plate shaped lid. The degree of freedom of design thus widens. In one or more embodiments of the present invention, the depth 230 of the first box body 200 is set to be greater than H1/2 and smaller than H1 with respect to the height H1 in which the loop height of the conductive wire 206a connected to the electronic component 201 is added to the height of the highest electronic component 201. Accordingly, the depth of the box of each box body can be made shallow and the drawing processing can be carried out, so that a plurality of recesses can be formed in one metal plate (alloy plate). Therefore, enhancement in productivity can be realized. The task of mounting the electronic components 201, 202 is also facilitated because the depth of the first box body 200 for mounting the electronic components 201, 202 is shallow. Accordingly, the enhancement in productivity can be realized.

In one or more embodiments of the present invention, the housing is obtained by fixing two box bodies. Therefore, the circuits do not need to be aligned, and the conductive adhesive does not need to be partially supplied. Accordingly, the enhancement in productivity can be realized.

Furthermore, when each box body expands or contracts due to change in the surrounding environmental temperature or the like, the stress concentrates at the bent site 220 (see FIG. 1) in each box body. Therefore, the concentration of stress on the joining portion 210 of the first box body 200 and the second box body 203 can be alleviated. The stripping of the joining portion of the first box body 200 and the second box body 203 thus can be suppressed.

Furthermore, in one or more embodiments of the present invention, the electronic components 201, 202 to be mounted in the first box body 200 are fixed by the potting portion 207 filled and cured in the first box body 200.

The electronic components 201, 202 thus can be more reliably fixed with respect to the first box body 200. Each electrical connecting portion can be protected.

In one or more embodiments of the present invention, the configuration of applying the laser beam to the joining portion 210 straightly when joining the first box body 200 and the second box body 203 is adopted, so that the laser beam welding task can be more easily and accurately carried out.

Furthermore, in one or more embodiments of the present invention, a plurality of recesses that become the box body is formed with respect to one metal plate (alloy plate) by setting the depth of each box body shallow, so that a plurality of electronic component mounting devices 20 can be manufactured with a series of manufacturing processes. Therefore, enhancement in productivity can be realized.

(Others)

The opening of the first box body 200 and the opening of the second box body 203 need to be joined over the entire periphery to realize a substantially sealed state for the interior of the housing. For instance, when carrying out the laser beam welding in the process F, the welding needs to be carried out basically by applying the laser beam over the entire periphery of the opening of each box body.

However, spot welding can be carried out not on the entire periphery but in a range where the electromagnetic shielding is not affected. In this case, however, the sealability may lower at the non-welded portion. Therefore, when carrying out spot welding, at least one of the nickel-iron alloy plate 320 and the nickel-alloy plate 330 has the surface coated with a thermoplastic resin such as urethane resin. At the time of spot welding, therefore, the resin at the periphery of the welding portion fuses and thereafter cures thus filling the gap of the non-welded portion.

Deformation such as warp tends to easily occur due to contraction by welding if the laser beam welding is carried out over the entire periphery of the opening, but such deformation is less likely to occur in the case of spot welding.

One or more applied examples of the electronic component mounting device according to one or more embodiments of the present invention described above will be described with reference to FIG. 4. Specifically, one or more applied examples in which the electronic component mounting device according one or more embodiments of the present invention is applied to the MEMS microphone will be described. Prior to describing one or more applied examples, the summary of the MEMS microphone chip configuring the MEMS microphone and the related art of the MEMS microphone will be described with reference to FIG. 6 and FIG. 7.

<MEMS Microphone>

An ECM (Electret Condenser Microphone) using an organic film is widely used in the related art as a compact microphone mounted on a portable telephone, or the like. However, an MEMS microphone including an MEMS (Micro Electro-mechanical System) by the semiconductor micromachining technique is adopted in recent years with demand to respond to further miniaturization, thinning, and solder reflow mounting (see patent document 6).

Figure 6:
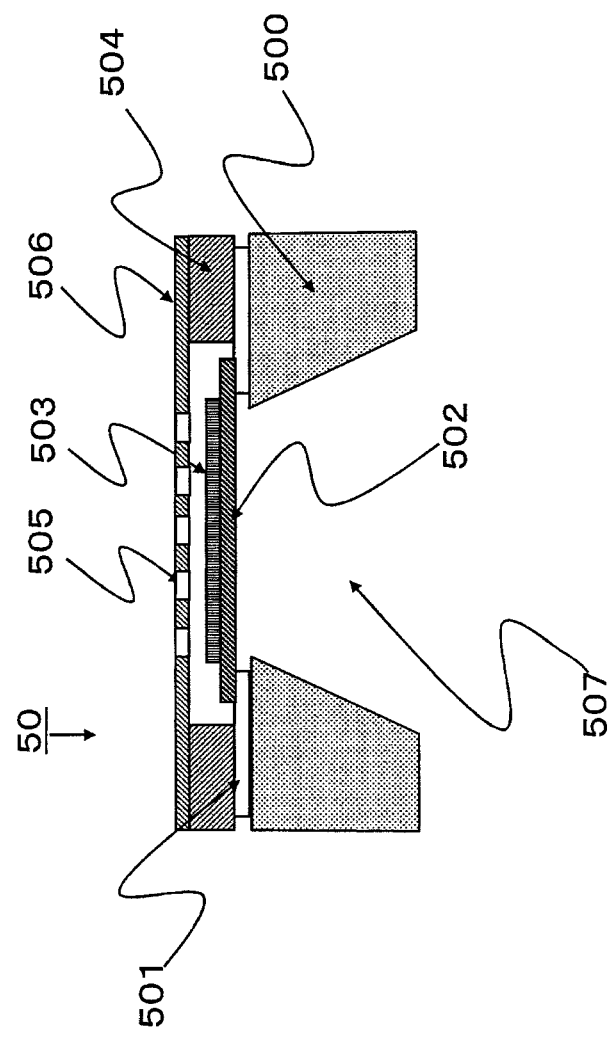
FIG. 6 is a schematic cross-sectional view of an MEMS microphone chip.

The MEMS microphone chip arranged in the MEMS microphone will be described with reference to FIG. 6.

The MEMS microphone chip 50 includes a vibration film electrode 502 and an electret film 503 on a silicon substrate 500 through an insulating layer 501. The vibration film electrode 502 and the electret film 503 are configured from silicon nitride, or the like. An insulating layer 504 is further stacked on the insulating layer 501 and a fixed electrode 506 is provided on the insulating layer 504 at the periphery of the vibration film electrode 502 and the electret film 503. There is a gap between the fixed electrode 506 and the electret film 503. The fixed electrode 506 is formed with a plurality of sound perforations 505. A space region 507 is provided on the rear surface side of the vibration film electrode 502 (side opposite to fixed electrode 506).

According to the MEMS microphone chip 50 configured as above, when the vibration film electrode 502 vibrates by sound pressure, the electrostatic capacitance of a plate capacitor configured by the vibration film electrode 502 and the fixed electrode 506 changes, and it is retrieved as voltage change.

Figure 7:
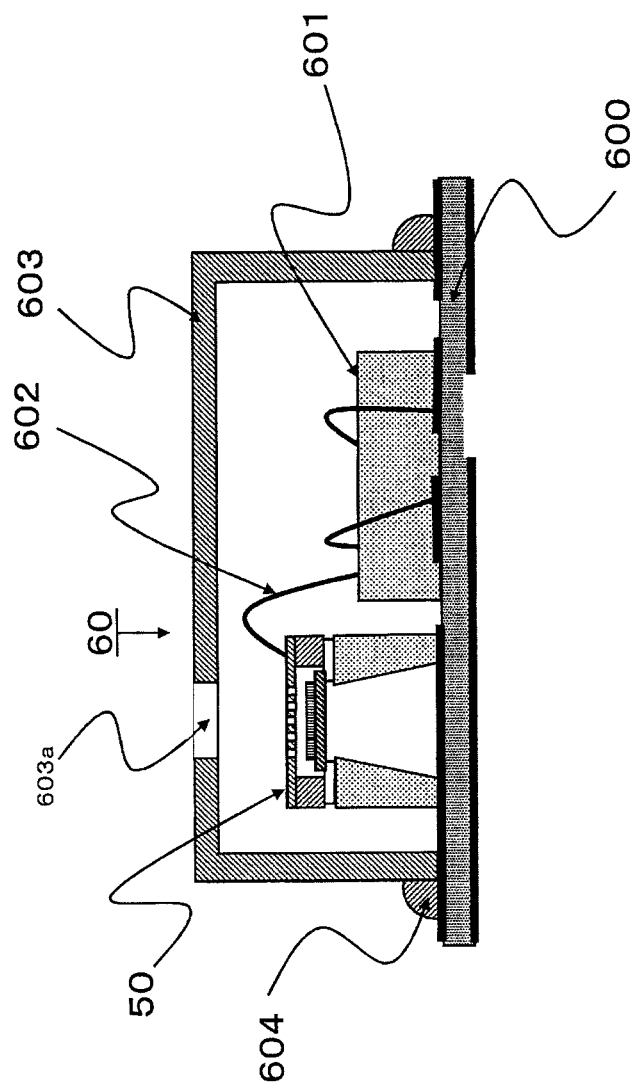
FIG. 7 is a schematic cross-sectional view showing an applied example (MEMS microphone) of the electronic component mounting device according to the related art example.

The related art of the MEMS microphone including the MEMS microphone chip 50 configured as above will be described with reference to FIG. 7. A MEMS microphone 60 according to the related art has the MEMS microphone chip 50 and an integrated circuit chip 601 mounted on a printed wiring board 600. The integrated circuit chip 601 carries out signal processing such as amplification on the electric signal from the MEMS microphone chip 50, where both chips are electrically connected by a conductive wire (metal wire) 602.

A cover case (box body) 603 made from a conductive metal material is fixed to the printed wiring board 600 so as to cover the MEMS microphone chip 50 and the integrated circuit chip 601. Therefore, in the MEMS microphone 60 according to the related art, the MEMS microphone chip 50 and the integrated circuit chip 601, which are electronic components, are mounted inside the housing configured by the printed wiring board 600 and the cover case 603.

The cover case 603 and the wiring circuit of the printed wiring board 600 are electrically connected by a solder 604, or the like. A multi-layer substrate in which a plurality of metal conductive layers is stacked is generally used for the printed wiring board 600 to prevent leakage of electromagnetic noise from the printed wiring board 600.

In the MEMS microphone 60 having such structure, the inter-electrode distance between the vibration film electrode 502 and the fixed electrode 506 in the MEMS microphone chip 50 greatly influences the fluctuation of characteristics. Thus, the deformation of the substrate supporting the MEMS microphone chip 50 needs to be suppressed small.

However, in the case of the related art, there is a demand to thin the printed wiring board 600 with demand for miniaturization and thinning, and hence it is difficult to maintain strong strength. Furthermore, the material cost and the manufacturing cost become high when exhibiting the electromagnetic shielding function because a multi-layered printed wiring board needs to be used for the printed wiring board 600, and the printed wiring board 600 and the cover case 603 need to be electrically connected with the solder and the like.

In the case of improving the SN ratio of the output signal of the MEMS microphone 60, the SN ratio can be adjusted by changing the shape of the sound perforation 603*a* formed in the cover case 603 and the cover case 603 itself. However, because the cover case 603 according to the related art has a shape that covers the entire mounting component, a sufficient gap needs to be ensured between the cover case 603 and various types of components in order to avoid contact between the cover case 603 and the mounting components, wire, or the like and to ensure a space of the potting portion. Therefore, the degree of freedom of design of the cover case 603 is small, and the adjustment of the SN ratio by the shape of the cover case 603 is difficult.

Figure 4:
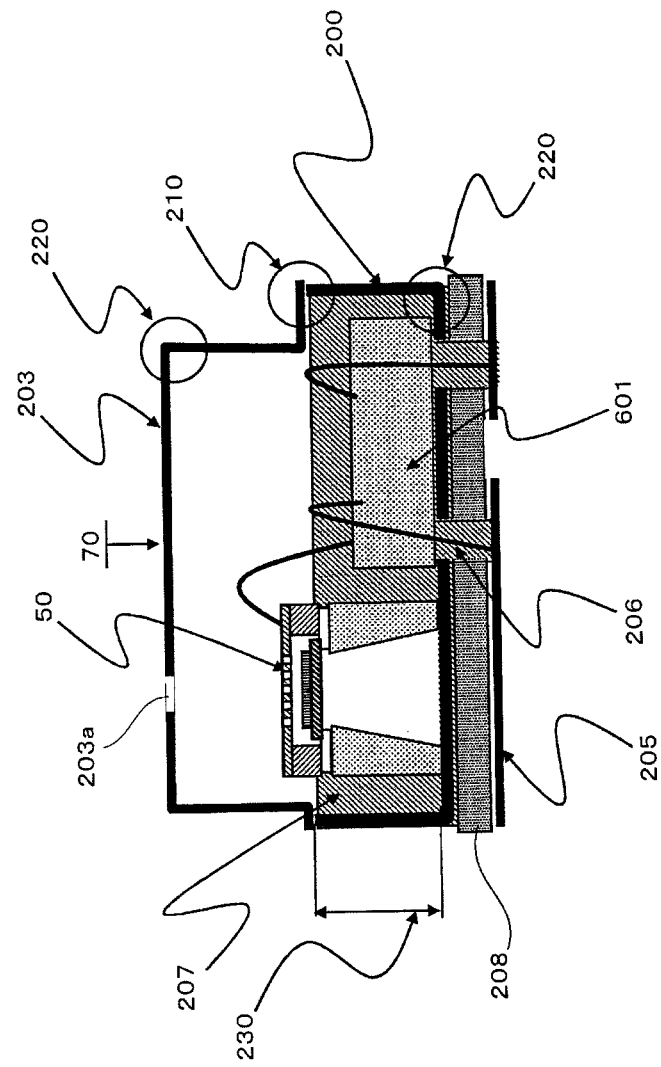
FIG. 4 is a schematic cross-sectional view showing an applied example (MEMS microphone) of the electronic component mounting device according to one or more embodiments of the present invention.
Figure 5:
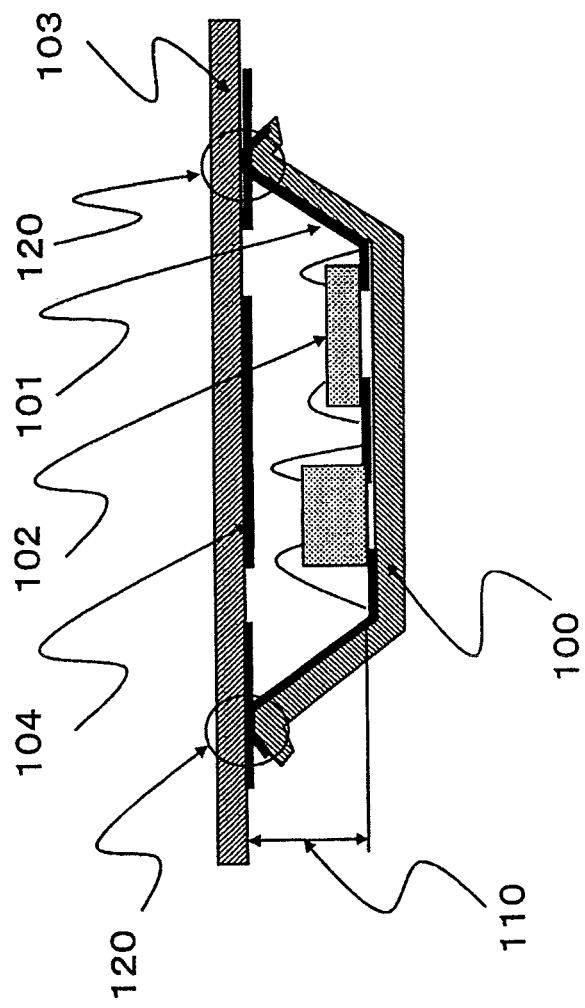
FIG. 5 is a schematic cross-sectional view of an electronic component mounting device according to a related art example.

One or more applied example embodiments in which the electronic component mounting device according to one or more embodiments of the present invention is applied to the MEMS microphone will be described with reference to FIG. 4.

In an MEMS microphone 70 according to one or more embodiments of the present invention, the electronic component 201 is assumed as the MEMS microphone chip 50 and the electronic component 202 is assumed as the integrated circuit chip 601 in the electronic component mounting device 20 according to one or more embodiments of the present invention described above. Other configurations are the same as the electronic component mounting device 20 according to one or more embodiments of the present invention described above, and hence the same reference numerals are denoted for the same configurations in FIG. 4. The sound perforation 203*a* is formed in the second box body 203 for the function of the MEMS microphone 70.

According to the MEMS microphone 70 of one or more embodiments of the present invention, the first box body 200 mounted with the MEMS microphone chip 50 is formed by configuring a metal plate to a three-dimensional box shape by sheet plate processing (drawing process), and thus has strong strength and is less likely to deform. Stable signal characteristics are thus obtained.

The second box body 203 is barely subjected to the limitation of the shape and arrangement of the MEMS microphone chip 50 and the integrated circuit chip 601 that are mounted. Therefore, the degree of freedom of design of the second box body 203 is high, and the SN ratio of the output signal of the MEMS microphone 70 can be adjusted by appropriately changing the shape of the second box body 203.

According to one or more embodiments of the present invention, sufficient electromagnetic shielding function can be obtained without using an expensive component such as a multi-layered printed wiring board. Obtaining sufficient electromagnetic shielding function is as described with respect to the electronic component mounting device 20.

The joining portion 210 of the first box body 200 and the second box body 203 is on a surface different from the mounting surface of the MEMS microphone chip 50. Thus, the stress applied when joining the first box body 200 and the second box body 203 concentrates at the bent site 220 in the first box body 200. Therefore, the stress load on the MEMS microphone chip 50 can be suppressed. Furthermore, the external mechanical stress such as thermal expansion and contraction concentrates at the bent site 220 of each boxy body and hence the concentration of stress on the joining portion 210 can be alleviated.

In one or more embodiments of the present invention, a sound perforation 505 formed at the upper part of the MEMS microphone chip 50 is provided at a position projecting toward the interior of the second box body 203 than the opening of the first box body 200 when the MEMS microphone chip 50 is fixed in the first box body 200 by the potting portion 207.

Therefore, when the liquid potting agent is filled in the first box body 200, the potting agent is suppressed from entering the MEMS microphone chip 50.

20 electronic component mounting device
50 microphone chip
70 microphone
200 first box body
201, 202 electronic component
203 second box body
204 through hole
205 conductive layer
206 conductive wire
207 potting portion
208 insulating layer
210 joining portion
220 bent site
300 copper foil
320 nickel-iron alloy plate
330 nickel-iron alloy plate
500 silicon substrate
501 insulating layer
502 vibration film electrode
503 electret film
504 insulating layer
505 sound perforation
506 fixed electrode
507 space region
601 integrated circuit chip While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

The invention claimed is:

1. An electronic component mounting device comprising:
    a housing formed from a conductive metal material and at least one electronic component mounted inside the housing,
    wherein the housing comprises a first box body and a second box body fixed so that respective openings face each other and has a conductive layer stacked through an insulating layer arranged on an outer side of the first box body,
    wherein the first box body comprises a through-hole for retrieving a conductive wire connected to the electronic component to the conductive layer,
    wherein the through-hole is arranged at a position covered by the conductive layer, wherein the electronic component mounted in the first box body is fixed by a potting portion filled in the first box body, wherein one of the electronic components is a MEMS microphone chip, and wherein a sound perforation formed at an upper part of the MEMS microphone chip is arranged at a position projecting out to the interior side of the second box body from the opening of the first box body when the MEMS microphone chip is fixed in the first box body by the potting portion.

2. The electronic component mounting device according to claim 1,
    wherein at least one of the electronic components mounted in the first box body is arranged in a state projecting out to an interior side of the second box body from the opening in the first box body.

3. The electronic component mounting device according to claim 2, wherein the electronic component mounted in the first box body is fixed by a potting portion filled in the first box body.

* * * * *